(12) United States Patent
Park et al.

(10) Patent No.: US 7,816,699 B2
(45) Date of Patent: Oct. 19, 2010

(54) POLARIZED LIGHT EMITTING DIODE

(75) Inventors: Q-Han Park, Seoul (KR); Won-Jun Choi, Seoul (KR); Heon-Su Jeon, Gyeonggi-do (KR)

(73) Assignee: Korea University Industrial & Academic Collaboration Foundation, Seoul (KR)

( * ) Notice: Subject to any disclaimer, the term of this patent is extended or adjusted under 35 U.S.C. 154(b) by 182 days.

(21) Appl. No.: 12/018,280

(22) Filed: Jan. 23, 2008

(65) Prior Publication Data

US 2008/0290336 A1    Nov. 27, 2008

(30) Foreign Application Priority Data

May 22, 2007   (KR) ...................... 10-2007-0049604

(51) Int. Cl.
*H01L 33/00* (2010.01)

(52) U.S. Cl. .............................. 257/98; 257/96; 257/99; 257/E33.067; 257/E33.068; 257/E33.069; 372/50.11; 372/50.12; 372/96; 438/32

(58) Field of Classification Search ................... 257/96, 257/98, 99, E33.067, E33.068, E33.069; 372/50.11, 50.12, 96; 438/29, 32
See application file for complete search history.

(56) References Cited

U.S. PATENT DOCUMENTS

| 2008/0128728 A1* | 6/2008 | Nemchuk et al. ............. 257/98 |
| 2008/0267236 A1* | 10/2008 | Sigalas et al. ............ 372/44.01 |
| 2009/0067774 A1* | 3/2009 | Magnusson ................. 385/10 |

FOREIGN PATENT DOCUMENTS

KR    10-2007-0079833    8/2007

* cited by examiner

*Primary Examiner*—Dao H Nguyen
(74) *Attorney, Agent, or Firm*—Locke Lord Bissell & Liddell, LLP

(57) ABSTRACT

Disclosed is a polarized light emitting diode (LED) capable of emitting polarized light in the front direction thereof by forming a first grating layer on a quantum well layer and forming a second grating layer on a substrate. The polarized LED includes a nitride thin film formed on a substrate, a quantum well layer formed on the nitride thin film, a first grating layer formed on the quantum well layer to allow a part of light generated from the quantum well layer to pass through the first grating layer and to reflect remaining light, and a second grating layer formed on the substrate to rotate the light reflected from the first grating layer such that the reflected light passes through the first grating layer.

6 Claims, 2 Drawing Sheets

POLARIZED LIGHT EMITTING DIODE

BACKGROUND OF THE INVENTION

1. Field of the Invention

The present invention relates to a polarized light emitting diode (LED). More particularly, the present invention relates to a polarized LED capable of emitting polarized light in the front direction thereof by forming a first grating layer on a quantum well layer and forming a second grating layer on a substrate.

2. Description of the Related Art

Since a thin film transistor liquid crystal display (TFT-LCD) is not a self-emissive device, it must use the light of a backlight unit (BLU) which is an additional light source. The amount of transmitted light is adjusted according to the movement of liquid crystal molecules in response to applied signal voltage. Here, a polarizing plate that only passes through light of one polarization is necessarily required in a display device in order to prevent interference or offset of the transmitted light.

Since the polarizing plate directly adjusts light, it plays an important role of adjusting the required characteristics (e.g. contrast, luminance) of LCD products.

As described above, an additional polarizing plate is necessary for completing LCD products. Accordingly, if LCD products are manufactured without using the additional polarizing plate, the highest production efficiency can be achieved.

Meanwhile, the light source of the BLU has mainly used a lamp such as a cold cathode fluorescent lamp (CCFL) and an external electrode fluorescent lamp (EEFL). Recently, an LED (point source) has been used as the light source. That is, various semiconductor light emitting devices such as LEDs and LDs (laser diodes) have been used as light sources for a display apparatus, an illumination apparatus, optical communication apparatus, memory apparatus and the like.

Among such semiconductor light emitting devices, there has been developed a light emitting device, in which a III-V group nitride thin film that includes at least three layers of P and N type III-V group nitride single crystal thin film layers and a light emitting layer having a quantum well structure is epitaxially-grown from a substrate such as a sapphire substrate, the P and N type III-V group nitride single crystal thin film layers being obtained by doping a component selected from the group consisting of gallium nitride (GaN), indium nitride (InN) and aluminum nitride (AlN) with N and P type impurities.

A light emitting device prepared in the form of a stack structure including an N-type semiconductor layer, a light emitting layer and a P-type semiconductor layer that mainly include at least one component selected from the group consisting of GaN, InN and AlN has been used as a light source for a signal generator, a backlight for liquid crystal displays and a general illumination that can be substituted for an incandescent lamp or a fluorescent lamp. In addition, the light emitting device may be used as a laser light source for a high capacity optical disk apparatus.

The LED has a simple structure for generating light for LCD products. At the present time, technology for generating polarized light by modifying or improving the structure of the LED has not been proposed.

If it is possible to generate polarized light by modifying or improving the structure of the LED, LCD products can be completed without using the polarizing plate. However, the technology as described above has not been presented.

SUMMARY OF THE INVENTION

The present invention has been made to solve the above problems occurring in the prior art, and an object of the present invention is to provide a polarized light emitting diode (LED) capable of emitting polarized light in the front direction thereof by forming a first grating layer on a quantum well layer and forming a second grating layer on a substrate.

Another object of the present invention is to provide a polarized light emitting diode (LED) capable of decreasing the total number of parts and reducing the manufacturing cost of LCDs by not requiring an additional polarizing plate.

In order to accomplish the above object, the present invention provides a polarized LED comprising: a nitride thin film formed on a substrate; a quantum well layer formed on the nitride thin film; a first grating layer formed on the quantum well layer to allow a part of light generated from the quantum well layer to pass through the first grating layer and to reflect remaining light; and a second grating layer formed on the substrate to rotate the light reflected from the first grating layer such that the reflected light passes through the first grating layer.

The first grating layer has a grating pattern direction different from a grating pattern direction of the second grating layer.

The first grating layer has a grating pattern formed in a diagonal direction.

The polarized LED further comprises a reflective layer formed below the second grating layer.

The nitride thin film comprises at least one selected from the group consisting of GaN, InN and AlN, and the substrate comprises a sapphire substrate.

DESCRIPTION OF THE EMBODIMENT

Hereinafter, a preferred embodiment of the present invention will be explained in detail with reference to the accompanying drawings.

Figure 1:
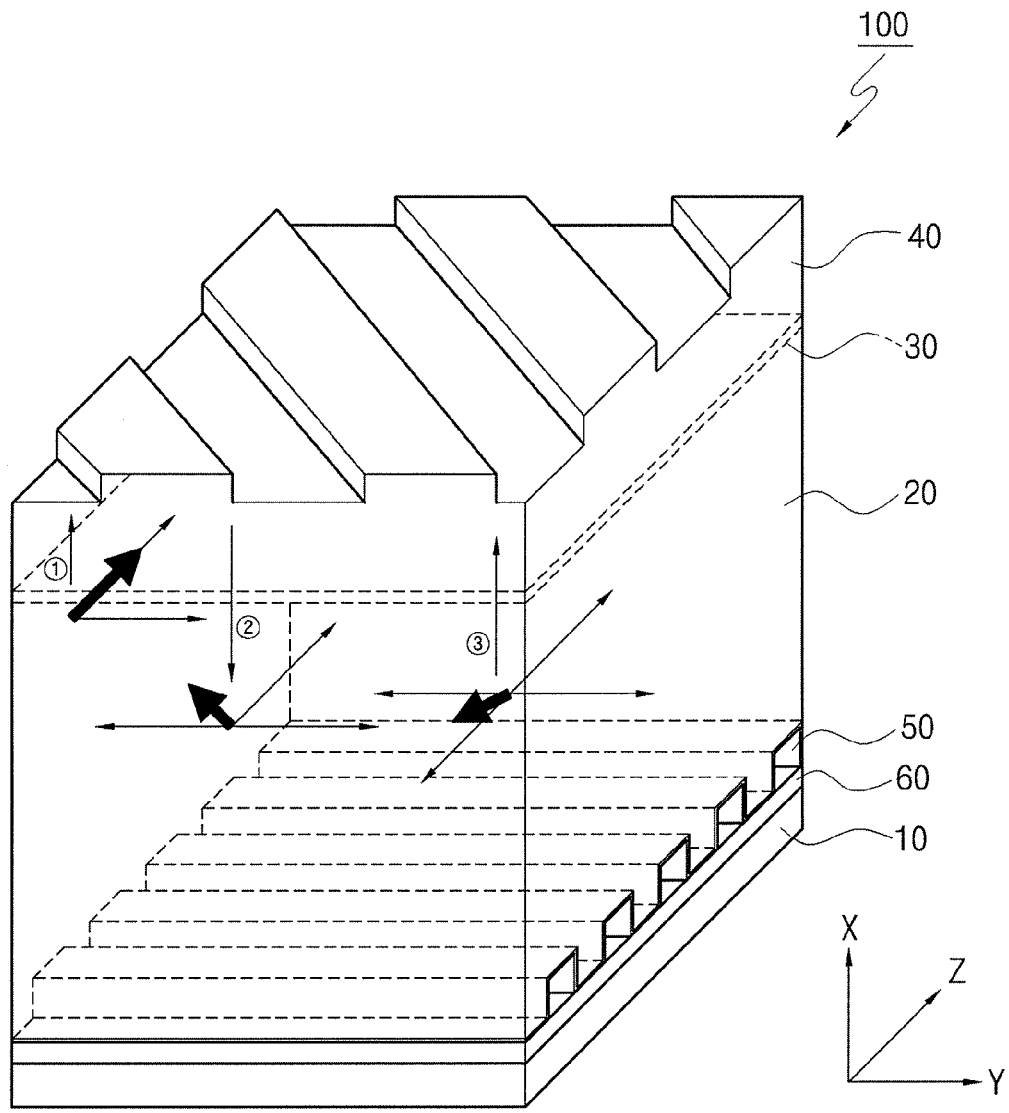
FIG. 1 is a perspective view of a polarized LED according to the present invention.
Figure 2:
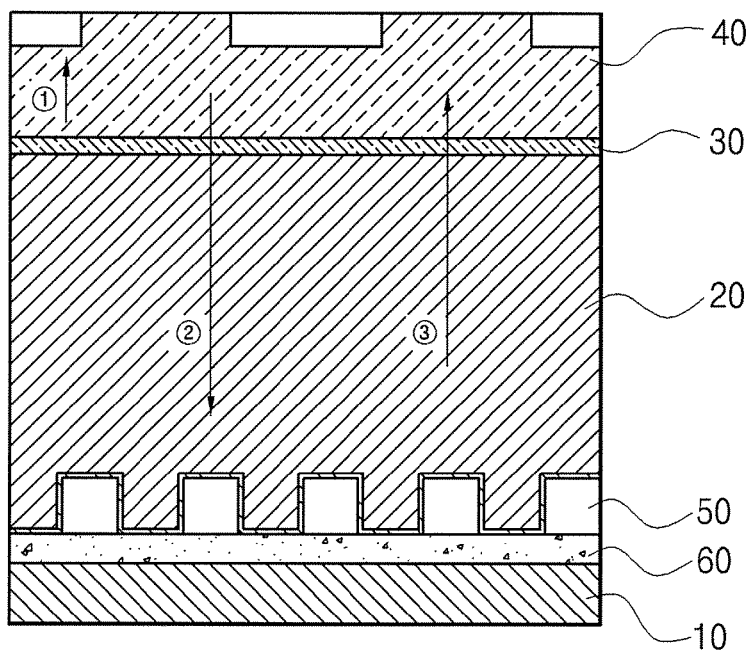
FIG. 2 is a vertical sectional view of a polarized LED according to the present invention.

FIG. 1 is a perspective view of a polarized LED according to the present invention and FIG. 2 is a sectional view of the polarized LED according to the present invention.

As shown in FIGS. 1 and 2, the polarized LED 100 according to the present invention comprises a nitride thin film 20 formed on a substrate 10, and a quantum well layer 30 formed on the nitride thin film 20. Preferably, the nitride thin film 20 includes at least one of GaN, InN and AlN and the substrate 10 includes a sapphire substrate.

According to the present invention, the structure of the LED 100 comprising the elements as described above is modified and improved. In detail the LED 100 has a structure for emitting most light, which is generated from the quantum well layer 30, in the front direction thereof.

As described above, in order to emit most of the light generated from the quantum well layer 30 in the front direction of the LED 100, a first grating layer 40 and a second grating layer 50 are formed in the LED 100.

First, the first grating layer 40 is formed on the quantum well layer 30. In one embodiment, the first grating layer may be a N-type or a P-type semiconductor layer which includes a component selected from the group consisting of GaN, InN, and AlN. The first grating layer 40 allows a part of the light generated from the quantum well layer 30 to pass therethrough and reflects remaining light in a polarized state. The first grating layer 40 includes a grating pattern having a predetermined shape. Preferably, the first grating layer 40 is formed in the oblique direction as shown in FIG. 1.

The light generated from the quantum well layer 30 includes two polarization components. Accordingly, the light having the two polarization components is generated from the quantum well layer 30 and then transmitted to the first grating layer 40.

Then, the first grating layer 40 passes through one of the two polarization components and reflects the other of the two polarization components. The reflected light (polarization component) is transmitted to the second grating layer 50.

Second, the second grating layer 50 is formed on the substrate 10 to rotate the polarized light reflected from the first grating layer 40. That is, the second grating layer 50 rotates the light reflected from the first grating layer 40 such that most of the reflected light can pass through the first grating layer 40. The second grating layer 50 includes a grating pattern having a predetermined shape and is offset from the first grating layer 40 by 45°.

The second grating layer 50 reflects the light while rotating the polarization direction of the light (polarization component) reflected from the first grating layer 40. The reason for rotating the polarization direction of the light (polarization component) reflected from the first grating layer 40 is to increase the amount of polarization components that easily pass through the first grating layer 40.

In this way, the light, which is transmitted to the first grating layer 40 after being reflected from the second grating layer 50, includes the polarization components that easily pass through the first grating layer 40.

Accordingly, most of the light, which is transmitted to the first grating layer 40 after being reflected from the second grating layer 50, is emitted in the front direction of the LED 100. At this time, there exists light (polarization component), which is reflected from the first grating layer 40 instead of passing therethrough.

However, the reflected light is polarized, rotated and reflected from the second grating layer 50 through the process as described above, so that the light is changed into light including polarization components that easily pass through the first grating layer 40.

As a result, such a process is repeated, so that most of the polarized light generated from the quantum well layer 30 can be emitted in the front direction of the LED 100 through the first grating layer 40.

As shown in FIGS. 1 and 2, the first grating layer 40 and the second grating layer 50 include a grating pattern having a predetermined shape, respectively. In order to emit most of the light in a polarized state, the first grating layer 40 and the second grating layer 50 preferably have grating pattern directions different from each other.

Preferably, the first grating layer 40 has a grating pattern formed in the diagonal direction. In such a case, the second grating layer 50 preferably has a grating pattern direction rotated by 45° with respect to the grating pattern direction of the first grating layer 40.

This represents that the second grating layer 50 is rotated at an angle of 45° with respect to the polarization direction of the light (polarization component) reflected from the first grating layer 40.

The second grating layer 50 divides the polarized light reflected from the first grating layer 40 into two polarizations perpendicular to each other. Further, a phase difference occurs between the two polarized lights due to the difference between refractive indices of two different materials constituting the thin layer of the second grating layer 50 while the two polarized lights are going into and out from the second grating layer 50.

At this time, the structure of the second grating layer 50 is properly modified, so that the light reflected from the first grating layer 40 can be rotated by 90° in the second grating layer 50 by using the phase difference. The light polarized by 90° as described above includes many components that easily pass through the first grating layer 40. Such a procedure is repeated, so that a large amount of light in a polarized state can be transmitted outside of the LED instead of discarding half of the light by means of a polarizing plate. Consequently, the cost reduction can be achieved and the optical efficiency can be increased.

Meanwhile, a reflective layer 60 is provided below the second grating layer 50 such that most of the light reflected from the first grating layer 40 can be polarized and then emitted through the first grating layer 40.

Hereinafter, a process in which the polarized light is emitted in the front direction of the LED 100 having the structure as described above will be explained.

Figure 3:
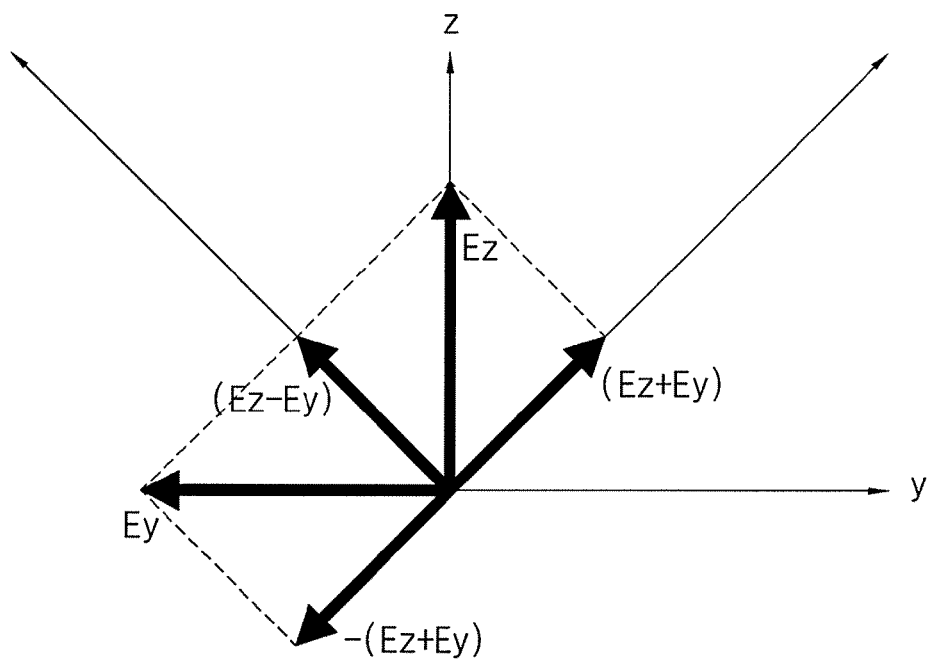
FIG. 3 is a view illustrating the polarization direction of a reflected light according to an embodiment of the present invention.

FIG. 3 shows a yz-coordinate axis, on which a y axis indicates the direction of the second grating layer 50, and a y'z'-coordinate axis obtained by rotating the yz-coordinate axis by 45°. In the y'z'-coordinate axis, a y' axis indicates the direction of the first grating layer 40.

In general, the light generated from the quantum well layer 30 is light in a non-polarized state, which has polarization components in all directions. For helping the understanding of the principle of the present invention, a description will be given under the assumption that light initially generated has polarization in the z axis direction, and the electric field of the light is expressed by a vector Ez.

The light can be regarded as the sum of two lights polarized in the y' and z' axis directions, and the electric field vector Ez can be expressed by the sum (i.e. Ez=Ey'+Ez') of two vectors perpendicular to each other. When the light reaches the first grating layer 40, since the light expressed by Ez' has a relatively large transmittance due to the grating filter effect and the light expressed by Ey' has a relatively large reflectivity, the light passing through the first grating layer 40 is primarily light polarized in the z' axis direction.

Secondarily, the light reflected from the first grating layer 40 is light having a polarization component in the y' axis direction, and reaches the second grating layer 50. When viewed in terms of the second grating layer 50, the light can be regarded as the sum (i.e. Ey'=Ey+Ez) of two lights polarized in the y and z axis directions.

The two lights expressed by Ey and Ez reach the first grating layer 40 after being reflected from the second grating layer 50 and the reflective layer 60. In the reflection process, the reflected lights Ey and Ez experience phase changes different from each other due to optical anisotropic properties of the second grating layer 50.

The structure of the second grating layer 50 is modified such that the phase change has a difference of 180°. In such a case, the reflected light is expressed by (Ey−Ez) and has polarization in the z' axis direction, so that the reflected light is changed into light having a polarization direction rotated by 90° as compared to the state before reflection.

Since the light can easily pass through the first grating layer 40, most of the light generated from the quantum well layer 30 is finally changed into the polarized light. Even if the initially generated light is light in different directions other than the z axis direction, the light is changed into polarized light by repeating the procedure including a plurality of reflection processes as described above.

Accordingly, the procedure is repeated, in which the light (polarization component) reflected from the first grating layer 40 is reflected from the second grating layer 50 after being polarized and rotated in the second grating layer 50, so that most of the non-polarized light generated from the quantum well layer 30 can be emitted in the front direction of the LED 100.

According to the polarized LED of the preferred embodiment of the present invention as described above, the first grating layer is formed on the quantum well layer and the second grating layer is formed on the substrate, so that the polarized light can be emitted in the front direction of the polarized LED.

Further, since LCD products may be completed without using a polarizing plate, the manufacturing cost can be significantly reduced.

What is claimed is:

1. A polarized light emitting diode (LED) comprising:
    a nitride thin film formed on a substrate;
    a quantum well layer formed on the nitride thin film;
    a first grating layer formed directly in contact with the quantum well layer to allow a part of light generated from the quantum well layer to pass through the first grating layer and to reflect remaining light; and
    a second grating layer formed on the substrate to rotate the light reflected from the first grating layer such that the reflected light passes through the first grating layer.

2. The polarized LED as claimed in claim 1, wherein the first grating layer has a grating pattern direction different from a grating pattern direction of the second grating layer.

3. The polarized LED as claimed in claim 2, wherein the first grating layer has a grating pattern formed in a diagonal direction.

4. The polarized LED as claimed in claim 1, further comprising a reflective layer formed below the second grating layer.

5. The polarized LED as claimed in claim 1, wherein the nitride thin film comprises at least one selected from the group consisting of GaN, InN and AlN.

6. The polarized LED as claimed in claim 1, wherein the substrate consists of a sapphire substrate.

* * * * *